(12) United States Patent
Kim et al.

(10) Patent No.: US 11,304,336 B2
(45) Date of Patent: Apr. 12, 2022

(54) CONVERTER

(71) Applicant: LG INNOTEK CO., LTD., Seoul (KR)

(72) Inventors: Geun Ho Kim, Seoul (KR); Ji Hyeon Baik, Seoul (KR); Jae Hoo Jung, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 17/146,927

(22) Filed: Jan. 12, 2021

(65) Prior Publication Data

US 2021/0136953 A1 May 6, 2021

Related U.S. Application Data

(63) Continuation of application No. 16/490,392, filed as application No. PCT/KR2018/003148 on Mar. 19, 2018, now Pat. No. 10,925,181.

(30) Foreign Application Priority Data

Mar. 21, 2017 (KR) .................. 10-2017-0035354
Jul. 7, 2017 (KR) .................. 10-2017-0086430

(51) Int. Cl.
*H05K 7/20* (2006.01)

(52) U.S. Cl.
CPC ......... *H05K 7/20327* (2013.01); *H05K 7/209* (2013.01); *H05K 7/20254* (2013.01);
(Continued)

(58) Field of Classification Search
CPC .......... H05K 7/20254; H05K 7/20327; H05K 7/20336; H05K 7/20509; H05K 7/209; H05K 7/20936
See application file for complete search history.

(56) References Cited

U.S. PATENT DOCUMENTS

2003/0140636 A1 7/2003 Van Winkle
2005/0259396 A1 11/2005 Barson et al.
(Continued)

FOREIGN PATENT DOCUMENTS

CN 1827293 A 9/2006
CN 101329147 A 12/2008
(Continued)

OTHER PUBLICATIONS

International Search Report in International Application No. PCT/KR2018/003148, dated Mar. 19, 2018.
(Continued)

*Primary Examiner* — Jacob R Crum
(74) *Attorney, Agent, or Firm* — Saliwanchik, Lloyd & Eisenschenk

(57) ABSTRACT

A converter comprises: a housing; a plurality of heat generating elements arranged at one surface of the housing; and a fluid channel arranged at the other surface of the housing, wherein the fluid channel includes an inlet and an outlet which connect and pass through an outside and an inside of the housing, is formed by a single line from the inlet to the outlet, has a constant cross-sectional area, and is arranged at a position where the fluid channel overlaps the plurality of heat generating elements in a vertical direction.

19 Claims, 12 Drawing Sheets

(52) U.S. Cl.
CPC ..... *H05K 7/20336* (2013.01); *H05K 7/20509* (2013.01); *H05K 7/20936* (2013.01)

(56) References Cited

U.S. PATENT DOCUMENTS

| | | |
|---|---|---|
| 2006/0198150 A1 | 9/2006 | Kinoshita et al. |
| 2007/0017658 A1 | 1/2007 | Lehman et al. |
| 2011/0277967 A1* | 11/2011 | Fried ................. F28D 15/04 165/104.26 |
| 2013/0140011 A1 | 6/2013 | Watanabe et al. |
| 2013/0284406 A1 | 10/2013 | Kawasaki |
| 2014/0096938 A1 | 4/2014 | Kojima et al. |
| 2015/0216081 A1 | 7/2015 | Huang |
| 2015/0282387 A1 | 10/2015 | Yoo et al. |
| 2016/0105998 A1* | 4/2016 | Lodholz ............ H05K 7/20272 361/698 |
| 2016/0120059 A1* | 4/2016 | Shedd ................. F25B 41/40 165/244 |
| 2016/0165762 A1* | 6/2016 | Borisov ............ H05K 7/20936 361/700 |
| 2016/0174411 A1* | 6/2016 | Lee ..................... F24F 1/24 165/80.3 |
| 2016/0320077 A1 | 11/2016 | Kim et al. |
| 2016/0330874 A1* | 11/2016 | Sato .................... F28D 15/06 |
| 2016/0338221 A1* | 11/2016 | Rush ................ H05K 7/20936 |
| 2016/0353606 A1* | 12/2016 | Ryoo ................ H05K 7/20936 |
| 2017/0221793 A1 | 8/2017 | Smalley et al. |
| 2017/0365890 A1* | 12/2017 | Lim .................. H01M 10/6556 |
| 2018/0041133 A1 | 2/2018 | Yang et al. |
| 2019/0313553 A1* | 10/2019 | Robillon ............ H05K 7/20872 |

FOREIGN PATENT DOCUMENTS

| | | |
|---|---|---|
| CN | 102419623 A | 4/2012 |
| CN | 103021977 A | 4/2013 |
| CN | 106091168 A | 11/2016 |
| EP | 2 007 183 A2 | 12/2008 |
| JP | H04-364379 A | 12/1992 |
| JP | 2004-356555 A | 12/2004 |
| JP | 2006-242415 A | 9/2006 |
| JP | 2007-281403 A | 10/2007 |
| KR | 10-2011-0009456 A | 1/2011 |

OTHER PUBLICATIONS

Supplementary European Search Report dated Feb. 14, 2020 in European Application No. 18770650.2.
Office Action dated Mar. 27, 2020 in Chinese Application No. 201880020039.6.
Office Action dated Jun. 26, 2020 in U.S. Appl. No. 16/490,392.
Notice of Allowance dated Oct. 13, 2020 in U.S. Appl. No. 16/490,392.

* cited by examiner

CONVERTER

CROSS-REFERENCE TO RELATED APPLICATIONS

This application is a continuation of U.S. application Ser. No. 16/490,392, filed Aug. 30, 2019; which is the U.S. national stage application of International Patent Application No. PCT/KR2018/003148, filed Mar. 19, 2018, which claims the benefit under 35 U.S.C. § 119 of Korean Application Nos. 10-2017-0035354, filed Mar. 21, 2017; and 10-2017-0086430, filed Jul. 7, 2017; the disclosures of each of which are incorporated herein by reference in their entirety.

TECHNICAL FIELD

The present invention relates to a converter.

BACKGROUND ART

As electrical devices of automobiles, engine electrical devices (starting devices, ignition devices, charging devices) and equalizing devices are generally used, however, recently, vehicles have become more electronically controlled, so that it becomes a trend that most of systems including chassis electrical devices are electricalized and electronized.

Various electrical devices such as lamps, audio, heaters, air conditioners, and the like that are being installed in automobiles are supplied with power from the battery when the automobiles are stopped, and supplied with power from the generator when driving, and at this time, the power generation capacity of the 14V power system is used as the normal power source voltage.

In recent years, with the development of the information technology industry, various new technologies (motor-driven power steering, Internet, etc.) aiming to increase the convenience of automobiles have been applied to vehicles, and it is expected that the development of new technologies that will make full use of current automobile systems will continue.

A hybrid electric vehicle (HEV), soft or hard type, is installed with a low-voltage DC-DC converter (DC-DC converter) for supplying a full load (12V). In addition, the DC-DC converter, which serves as an alternator for general gasoline vehicles, reduces the high voltage of the main battery (usually a high-voltage battery of 144V or more) and supplies 12V for the loads of the electrical devices.

DC-DC converter refers to an electronic circuit device that converts a DC current source of a certain voltage to a DC current source of a different voltage, and has been used in various fields such as a television receiver, an electrical device of an automobile, and the like.

FIG. 1 is an exploded perspective view showing a converter according to a prior art.

Referring to FIG. 1, the outer appearance of a converter 1 according to the prior art is formed by a housing 8. A plurality of heat generating elements for generating heat is provided on one surface of the housing 8 and a refrigerant fluid channel 2 is formed on the other surface of the housing 8 so that the refrigerant for absorbing the generated heat flows.

A refrigerant fluid channel 2 forms a path defined from the refrigerant inlet 4 to the refrigerant outlet 5 such that the refrigerant circulates on the other surface of the housing 8. The refrigerant inlet 4 and the refrigerant outlet 5 are formed spaced apart from each other on the side surface of the housing 8. Therefore, the refrigerant flowing into the refrigerant inlet 4 absorbs the heat of the converter 1 along the refrigerant fluid channel 2 and flows out to the refrigerant outlet 5.

A cover 3 for covering the refrigerant fluid channel 2 is coupled to the other surface of the housing 8. A sealing member (not shown) may be provided between the cover 3 and the housing 8 to inhibit the refrigerant from flowing out to the outside. The refrigerant inlet 4 and the refrigerant outlet 5 may respectively be coupled with a separate pipe or provided with a connector 6 for sealing.

According to the above-described prior art, since a separate sealing member is additionally disposed to inhibit the refrigerant from flowing out to the outside, there is a problem that the number of components increases and the manufacturing cost increases. In addition, since the cover 3 for covering the refrigerant fluid channel 2 is provided separately from the housing 8, there is a disadvantage that a separate process for assembling between the components is required.

In addition, a plurality of heat generating elements for generating heat are disposed inside or outer surface of the converter. Examples of the heat generating elements comprise a printed circuit board on which a plurality of electronic components are mounted, a transformer for voltage regulation, and an inductor for obtaining an inductance. The heat generated from the above elements may cause overloading of each electronic component, thereby causing malfunction of the setting function, and causing failure.

Therefore, various methods for dissipating heat of the converter have been proposed. The heat generated from the heat generating elements is absorbed by the refrigerant by forming a refrigerant fluid channel in the converter itself for circulating the refrigerant, or providing a separate refrigerant tube wherein the refrigerant is circulated. Also, a technique has been proposed in which heat dissipating fins are formed on the outer surface of the converter to increase the area and thereby the heat generated inside is discharged to the outside.

DETAILED DESCRIPTION OF THE INVENTION

Technical Subject

The present embodiment is intended to provide a converter capable of reducing the manufacturing cost in accordance with the reduction in the number of components. Also, it is intended to provide a converter capable of efficiently dissipating heat generated from heat generating elements.

Technical Solution

As an embodiment, a converter comprises: a housing; a plurality of heat generating elements arranged at one surface of the housing; and a fluid channel arranged at the other surface of the housing, wherein the fluid channel includes an inlet and an outlet which connect and pass through an outside and an inside of the housing, is formed by a single line from the inlet to the outlet, has a constant cross-sectional area, and is arranged at a position where the fluid channel overlaps the plurality of heat generating elements in a vertical direction.

In the fluid channel, a cooling pipe in which refrigerant flows corresponding to the shape of the fluid channel may be arranged.

The both ends of the cooling pipe may be exposed towards the outside of the housing from the inlet and the outlet.

The cooling pipe and the housing may be integrally formed by an insert injection molding method.

A cover that couples with the other surface so as to surround the fluid channel may be further included.

The cover may be formed integrally with the housing and may be the same material as the housing.

The housing may comprise a stepped portion formed on the other surface corresponding to the shape of the flow channel, and a plurality of radiating fins formed by being protruded from an area other than the stepped portion.

The surface facing the heat generating elements of the inner circumferential surface of the flow channel may be a planar surface.

The cooling pipe may have a plurality of linear portions and a plurality of bent portions connecting the linear portions, wherein the flow rate of the refrigerant flowing through the linear portions may be constant.

The bent portions may be disposed opposite to a region facing the heat generating elements.

Advantageous Effects

According to the present invention, since a cooling pipe for refrigerant flow is integrally formed with the housing, neither a separate cover nor a component for sealing is required, and thus there is an advantage in that the number of components is reduced and the manufacturing cost is reduced.

In addition, since the region, where the heat generating elements are arranged in the cooling pipe and the fluid channel, is heat dissipated intensively through the plurality of linear portions and the bent portions, there is an advantage that the heat radiation efficiency can be increased. Particularly, since a planar surface portion is formed at the end surface of the cooling pipe and the fluid channel facing the heat generating elements, there is an advantage that the cross-sectional area for heat dissipation can be increased.

In addition, since a bracket is brought into contact with a plurality of regions of the case, heat generated inside the case can be dissipated efficiently.

Particularly, since the regions where the bracket is in contact with the case are symmetrical with respect to the center of the case, it is advantageous in that uniform heat dissipation becomes possible.

BEST MODE

Figure 1:
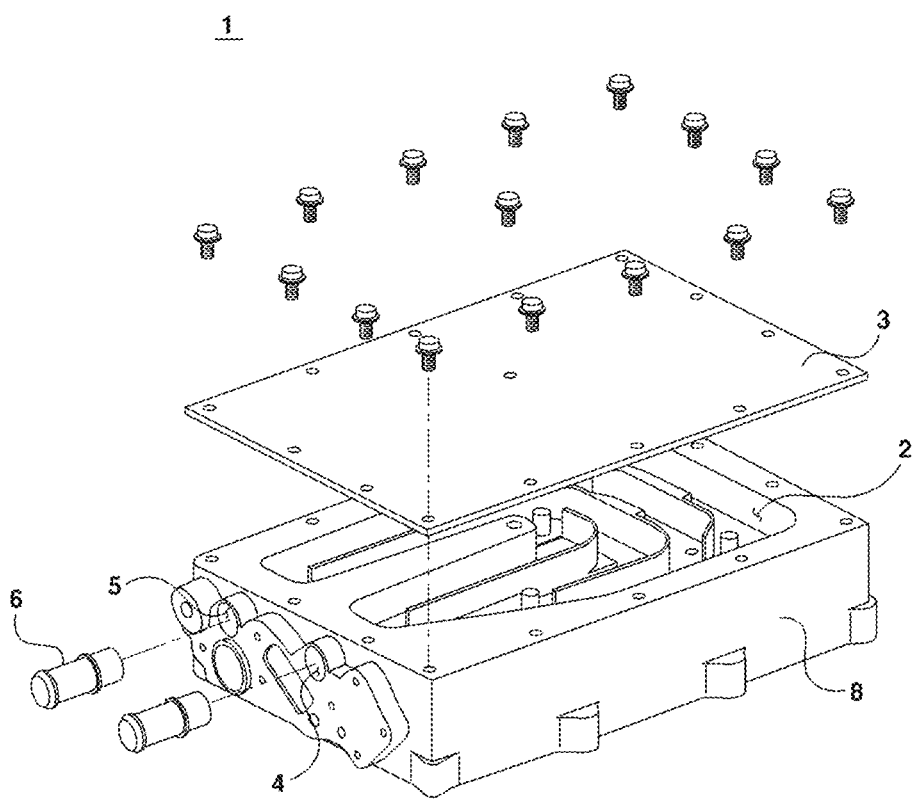
FIG. 1 is an exploded perspective view showing a converter according to a prior art.

Since the present invention, which will be described below, may be subject to various modifications and may have various exemplary embodiments, some specific exemplary embodiments are illustrated in the drawings and will be described in detail in the detailed description.

This, however, is by no means to restrict the invention to the specific embodiments, it is to be understood as embracing all modifications, equivalents and substitutes included in the spirit and scope of the present invention. If the specific description of the related art in the following description of the present invention that are determined to obscure the gist of the invention, the detailed description thereof is omitted.

The terms used in the present specification are merely used to describe particular exemplary embodiments, and are not intended to limit the present invention. Expressions in singular forms include plural forms unless the context clearly indicates otherwise. In this application, the terms "comprise," "have," and the like are intended to specify the features, numbers, steps, actions, components, parts, or one that exists combinations thereof described in the specification, but are not intended to preclude the one or more other features, numbers, steps, actions, components, parts, or the presence or possibility of combinations thereof.

Further, terms such as "first", "second" may be used to separately describe various elements, but the above elements shall not be restricted to the above terms. These terms are only used to distinguish one element from the other.

Figure 2:
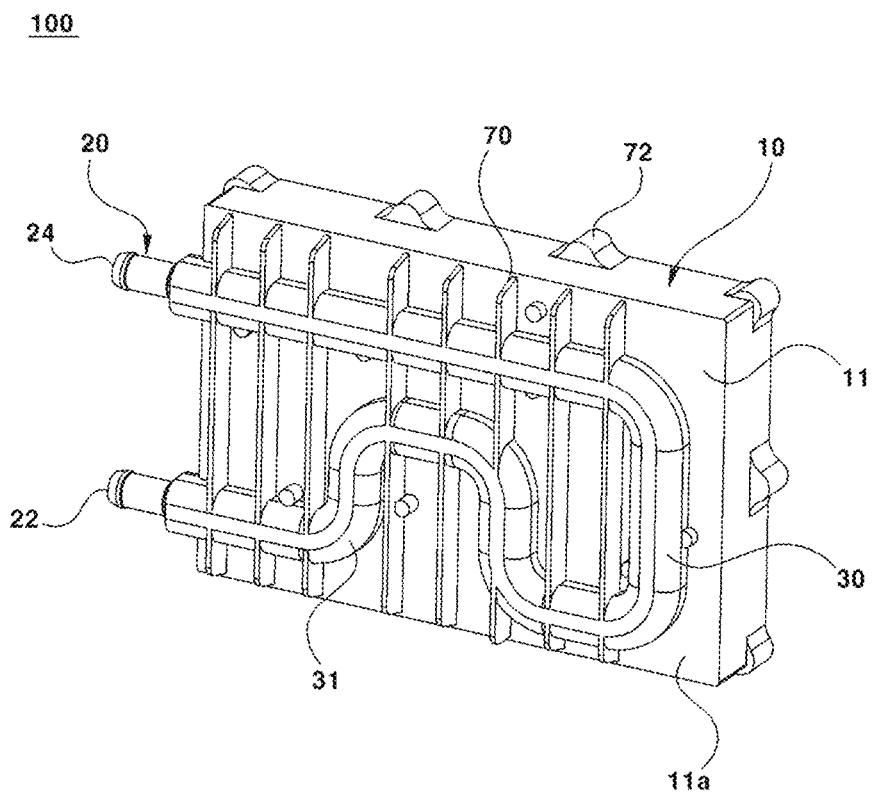
FIG. 2 is a perspective view of the converter according to an embodiment of the present invention.
Figure 3:
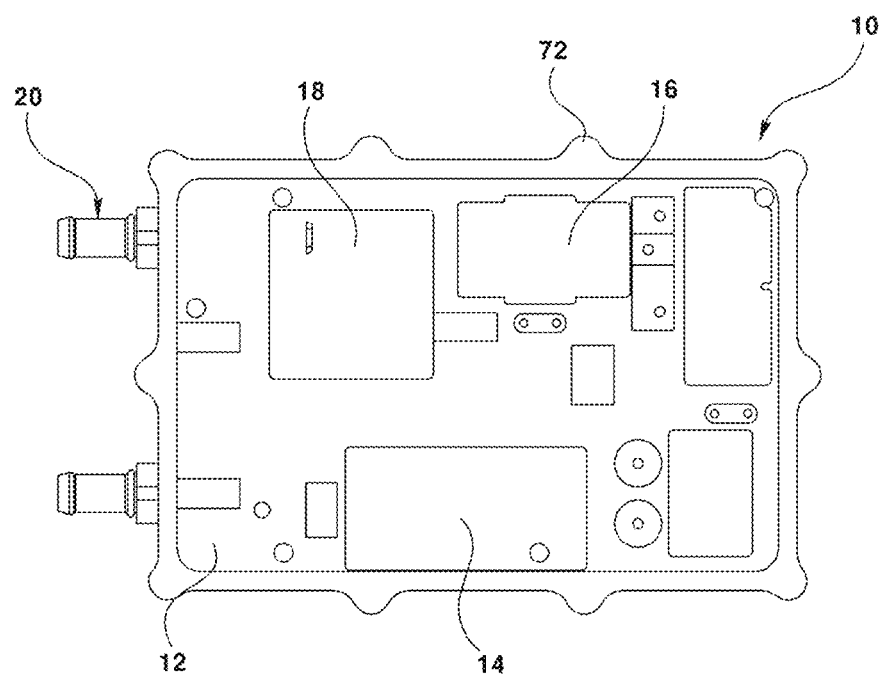
FIG. 3 is a cross-sectional view showing one surface of the converter according to the embodiment of the present invention.

FIG. 2 is a perspective view of the converter according to an embodiment of the present invention; FIG. 3 is a cross-sectional view showing one surface of the converter according to the embodiment of the present invention; and FIG. 4 is a cross-sectional view showing other surface of the converter according to the embodiment of the present invention.

Figure 4:
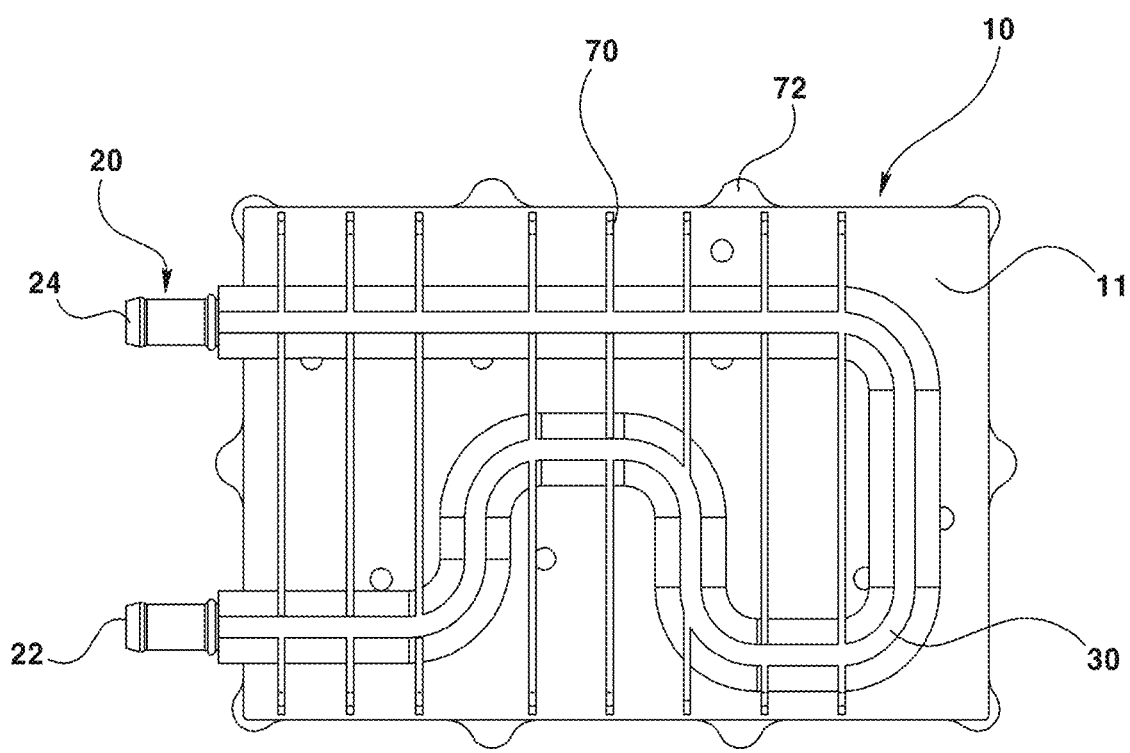
FIG. 4 is a cross-sectional view showing other surface of the converter according to the embodiment of the present invention.

Referring to FIGS. 2 to 4, a converter 100 according to an embodiment of the present invention includes a housing 10, a plurality of heat generating elements 14, 16, and 18 arranged on one surface 12 of the housing 10, and a fluid channel 30 disposed on the other surface 11 of the housing 10.

The converter according to the present embodiment is an electrical device provided in an automobile, an air conditioner, and the like, and is an electronic circuit device that performs conversion from a power source of a certain voltage to a power source of a different voltage. For example, the converter 100 may be a DC-DC converter. However, the configuration according to the present embodiment is not limited thereto, and can be applied to various electrical devices including the above-described types.

The housing 10 has a rectangular cross-sectional shape and includes a fluid channel 30 in which a cooling pipe 20 is disposed and a plurality of heat generating elements 14, 16, and 18. The heat generating elements 14, 16, and 18 are arranged on one surface 12 of the housing 10 to generate heat according to the operation of the converter 100. At this time, a separate cover (not shown) for covering the heat generating elements 14, 16, and 18 may be coupled to the one surface 12 of the housing 10.

Alternatively, it is possible to configure in a way that a plurality of internal spaces which are mutually divided is formed in the housing 10 so that the plurality of heat generating elements 14, 16, and 18 are disposed in the internal space adjacent to the one surface 12, and the fluid channel 30 is formed in the internal space adjacent to the other surface 11.

The heat generating elements 14, 16, and 18 may include a substrate 14 on which a plurality of electronic components are mounted, a transformer 16 for controlling the voltage, and an inductor 18 for obtaining the inductance. It is to be understood that any configuration which is disposed in the converter 100 and generate heat according to the operation is included as the heat generating elements 14, 16, and 18 of the embodiment of the present invention.

A fluid channel 30 disposed with a refrigerant pipe 20 through which refrigerant flows is formed on the other surface 11 of the housing 10. Due to the fluid channel 30, the other surface 11 of the housing 10 may be formed in a way that the region where the fluid channel 30 is formed to be more protruded than the other regions.

Meanwhile, a cover 11a may be disposed on the other surface 11 of the housing 10 for covering the fluid channel 30 through the coupling with the other surface 11. The cover 11a may be formed of the same material as the housing 10, and may be integrally formed with the housing 10.

As described above, a stepped portion 31 may be provided on the other surface 11 of the housing 10 so as to be protruded from the other region due to the fluid channel 30. One or more heat dissipating fins 70 protruding from the other surface 11 are provided on the other surface 11 of the housing 10 except for the stepped portion 31. The heat dissipating fins 70 are disposed in plural spaced apart from each other to increase the cross-sectional area of the other surface 11 so that the heat generated in the heat generating elements 14, 16, and 18 can be more easily discharged to the outside. Also, separate heat dissipating fins 72 may be provided on the side surface of the housing 10 to expand the cross-sectional area.

Figure 5:
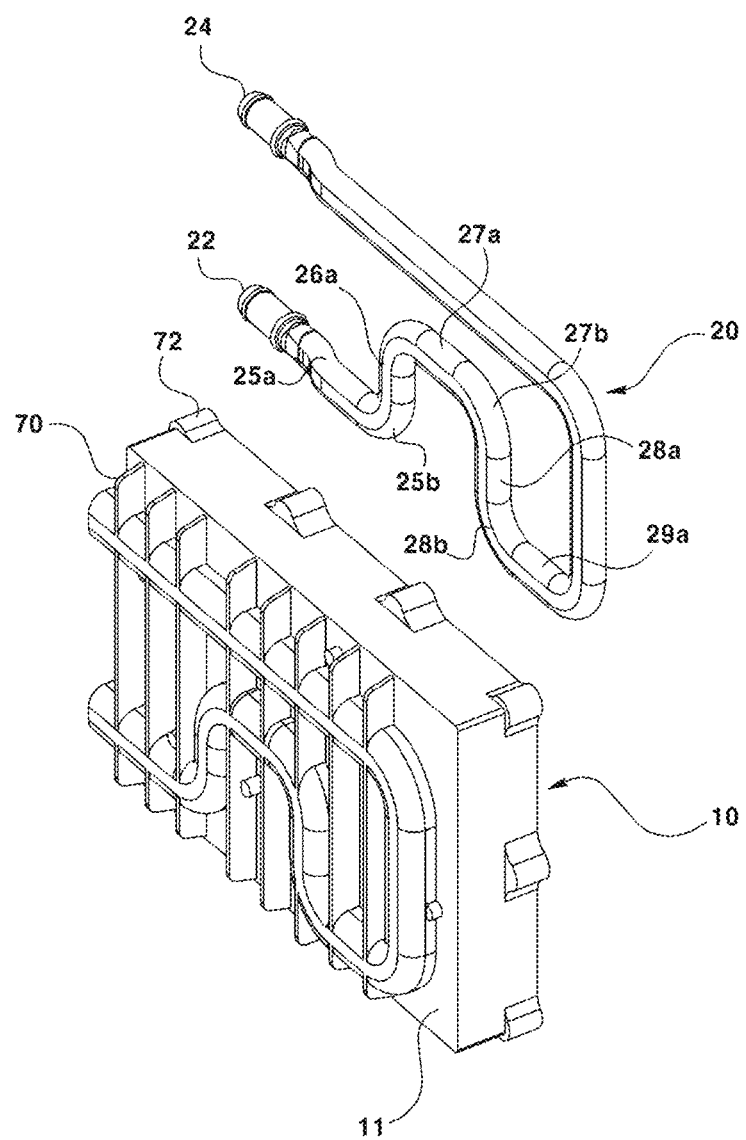
FIG. 5 is an exploded perspective view of the converter according to the embodiment of the present invention.
Figure 6:
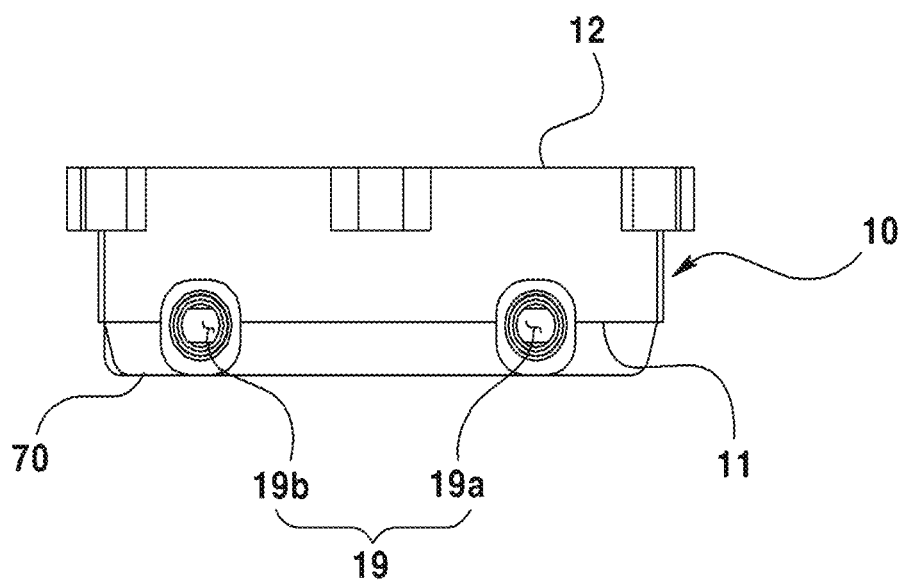
FIG. 6 is a cross-sectional view showing a side surface of a housing according to the embodiment of the present invention.

FIG. 5 is an exploded perspective view of the converter according to the embodiment of the present invention, and FIG. 6 is a cross-sectional view showing a side surface of a housing according to the embodiment of the present invention.

Referring to FIGS. 2, 5, and 6, a fluid channel 30 disposed with the cooling pipe 20 is formed in the housing 10. Specifically, the fluid channel 30 is formed by a single line from an inlet hole 19a to an outlet hole 19b. That is, the side surface of the housing 10 is formed with a through hole 19 for exposing both ends 22 and 24 of the cooling pipe 20 to the outside. The through hole 19 is a region defined by the inlet hole 19a and the outlet hole 19b and it is understood that a boundary between the fluid channel 30 and the outside of the housing 10 is formed thereby. Since the fluid channel 30 is formed in a single line, it is obvious that it is communicating with the inlet hole 19a and the outlet hole 19b inside of the housing 10.

The cross-sectional area of the fluid channel 30 is uniformly formed throughout the entire section. In other words, the width of the inner circumferential surface of the fluid channel 30 may be uniformly formed in the entire region. It can also be understood that the cross-sectional area of the outer circumferential surface of the cooling pipe 20 disposed in the fluid channel 30 is uniformly disposed. Since the cooling pipe 20 is disposed on the fluid channel 30, the shape and cross-sectional area of the fluid channel 30 are corresponding to the shape and the cross-sectional area of the cooling pipe 20. As a result, the flow rate of the refrigerant flowing through the cooling pipe 20 can be relatively constant in the entire region. Therefore, since the refrigerant is not stagnated in a specific region, the housing 10 can have a uniform temperature distribution over the entire region.

The fluid channel 30 and the cooling pipe 20 may be overlapped with each other in a vertical direction with the plurality of heat generating elements 14, 16 and 18 disposed on one surface 12 of the housing 10. That is, the plurality of heat generating elements 14, 16 and 18 disposed on one surface 12 of the housing 10 may be positioned to face the fluid channel 30 and the cooling pipe 20 respectively. To this end, the fluid channel 30 and the cooling pipe 20 may comprise linear portions and a plurality of bent portions connecting the linear portions.

In detail, both ends of the cooling pipe 20 through which the refrigerant flows are provided with an inlet 22 through which the refrigerant is introduced and an outlet 24 through which the refrigerant having undergone the heat exchange is discharged, respectively. The inlet 22 is understood as one end of the cooling pipe 20 which is exposed to the outside of the housing 10 through the inlet hole 19a and the outlet 24 is understood as the other end of the cooling pipe 20 which is exposed to the outside through the outlet hole 19b.

A plurality of linear portions and a plurality of bent portions are disposed between the inlet 22 and the outlet 24. For example, the cooling pipe 20 includes a first linear portion 25a extending horizontally from the inlet 22, a first bent portion 25b extending inwardly from the end of the first linear portion 25a, and a second linear portion 26a extending horizontally from the end of the first bent portion 25b. Also, at the end of the second linear portion 26a, the third linear portion 27a, the second bent portion 27b, the fourth linear portion 28a, the third bent portion 28b, the fifth linear portion 29a, and the like may further be included toward the outlet 24. The bent portion having a relatively large cross-sectional area is disposed at a position being overlapped with the heat generating elements 14, 16 and 18 in the vertical direction, so that the heat generated from the heat generating elements 14, 16 and 18 can be absorbed more. That is, the fluid channel 30 and the cooling pipe 20 are concentrated in the disposed region of the heat generating elements 14, 16 and 18, which are relatively high temperature regions, so that the heat dissipation efficiency can be further increased.

Meanwhile, the cooling pipe 20 may be formed integrally with the housing 10. That is, the cooling pipe 20 and the housing 10 can be integrally manufactured by insert injection molding method. Therefore, a separate cover for covering the cooling pipe 20 is not required, and thus there is an advantage that the number of components is reduced.

Figure 7:
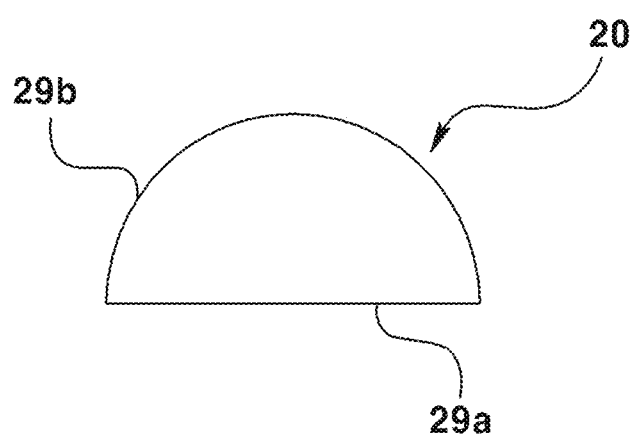
FIG. 7 is a cross-sectional view of a cooling pipe according to the embodiment of the present invention.

FIG. 7 is a cross-sectional view of a cooling pipe according to the embodiment of the present invention.

Referring to FIG. 7, a planar surface portion 29a and a curved surface portion 29b are formed in the cross-section of the cooling pipe 20 according to the embodiment of the present invention. A planar surface portion and a curved surface portion are also formed on the inner circumferential surface of the fluid channel 30 so as to be corresponding to the planar surface portion 29a and the curved surface portion 29b. The planar surface portion 29a is formed on a surface of the outer surface of the cooling pipe 20 facing the heat generating elements 14, 16, and 18. Due to this, the planar surface portion 29a is formed on the outer surface of the fluid channel 30 and the cooling pipe 20 facing the heat generating elements 14, 16, and 18 so that the cross-sectional area is increased relative to the other regions and thus there is an advantage that the refrigerant can absorb a larger amount of heat.

According to the converter 100 having the above-described configuration, since the cooling pipe for refrigerant flow is integrally formed with the housing, a separate cover or a component for sealing is unnecessary and thus there is an advantage that the number of components is reduced, thereby reducing the manufacturing cost.

In addition, since the regions, where the heat generating elements are arranged, are heat dissipated intensively through the plurality of linear portions and the bent portions in the cooling pipe and the fluid channel, there is an advantage that the heat radiation efficiency can be increased. Particularly, since the planar surface portion is formed at the end surface of the cooling pipe and the fluid channel facing the heat generating elements, there is an advantage that the cross-sectional area for heat dissipation can be increased.

Hereinafter, a converter according to the second embodiment of the present invention will be described.

In this embodiment, the other portions are the same as those of the first embodiment, but there is a difference in the heat dissipating structure. Hereinafter, only the characteristic portions of the second embodiment will be described, and the description of the first embodiment will be referred to in other portions.

Figure 8:
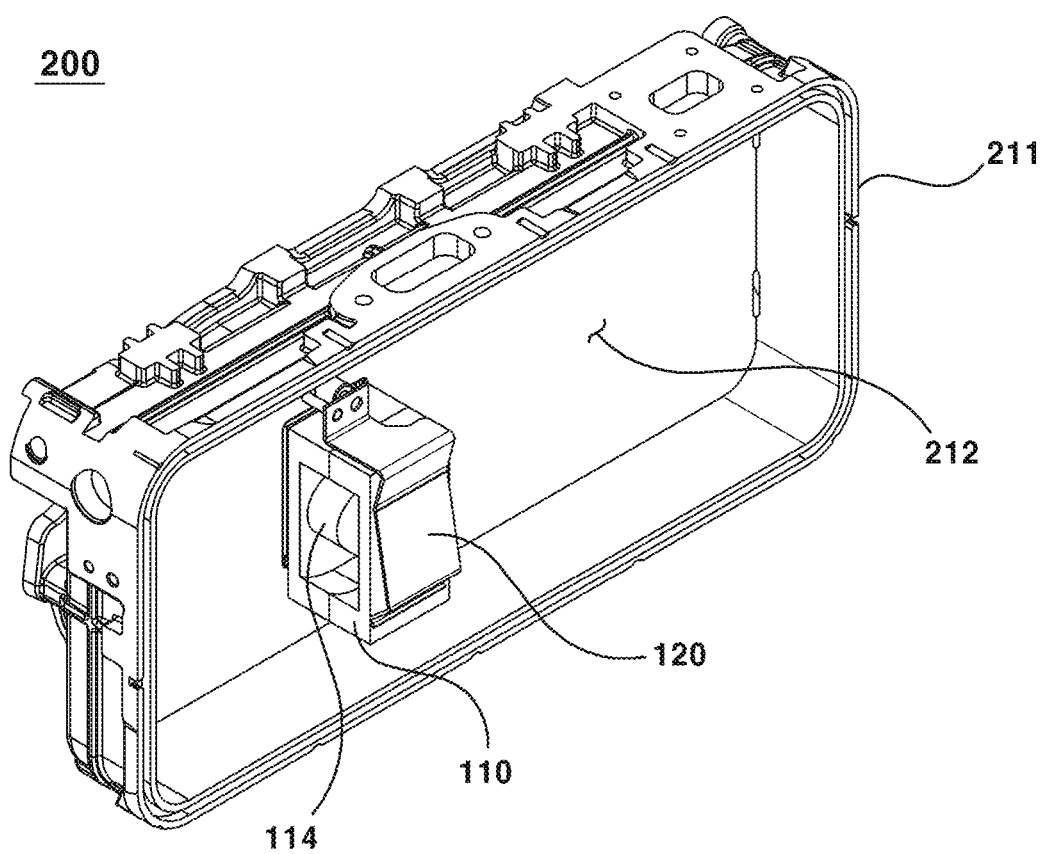
FIG. 8 is a perspective view of a converter according to a second embodiment of the present invention.
Figure 9:
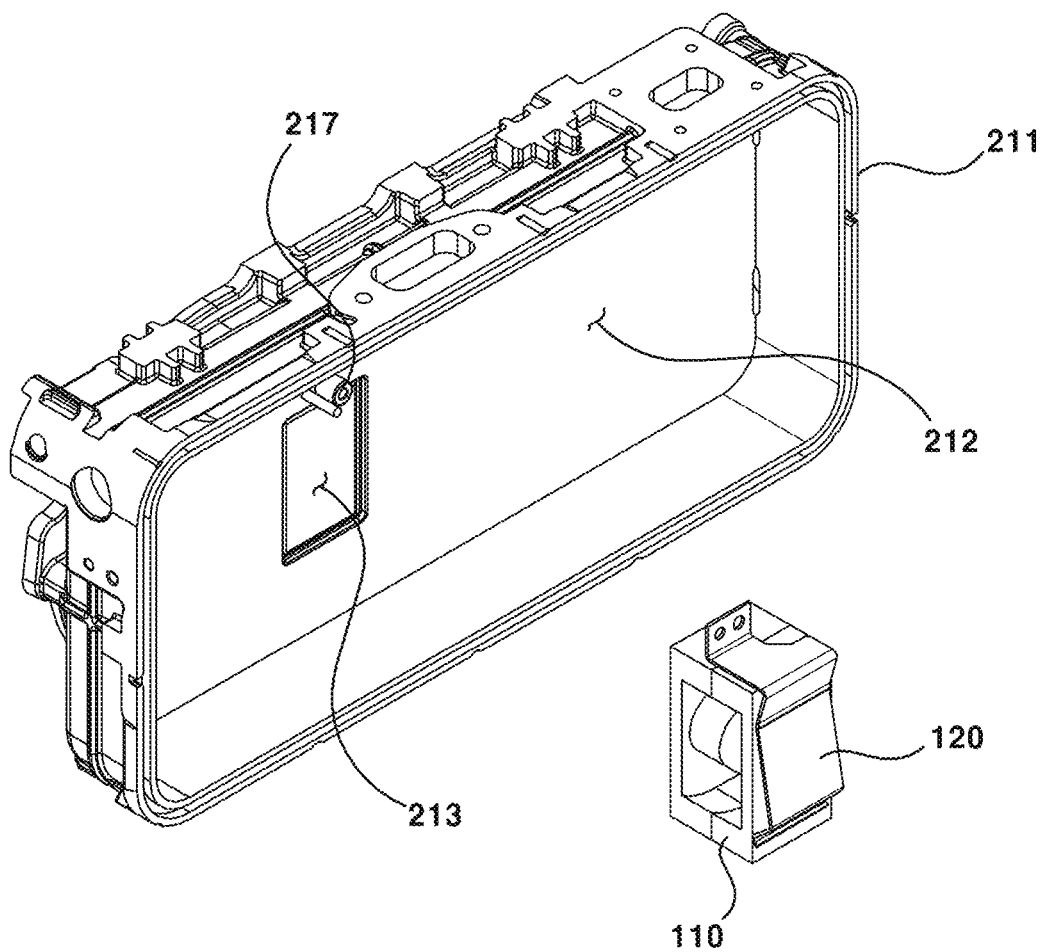
FIG. 9 is a cross-sectional view showing a configuration of the converter according to the second embodiment of the present invention.

FIG. 8 is a perspective view of a converter according to a second embodiment of the present invention; FIG. 9 is an exploded perspective view of a converter according to the second embodiment of the present invention; and FIG. 10 is a perspective view showing the rear surface of the converter according to the second embodiment of the present invention.

Figure 10:
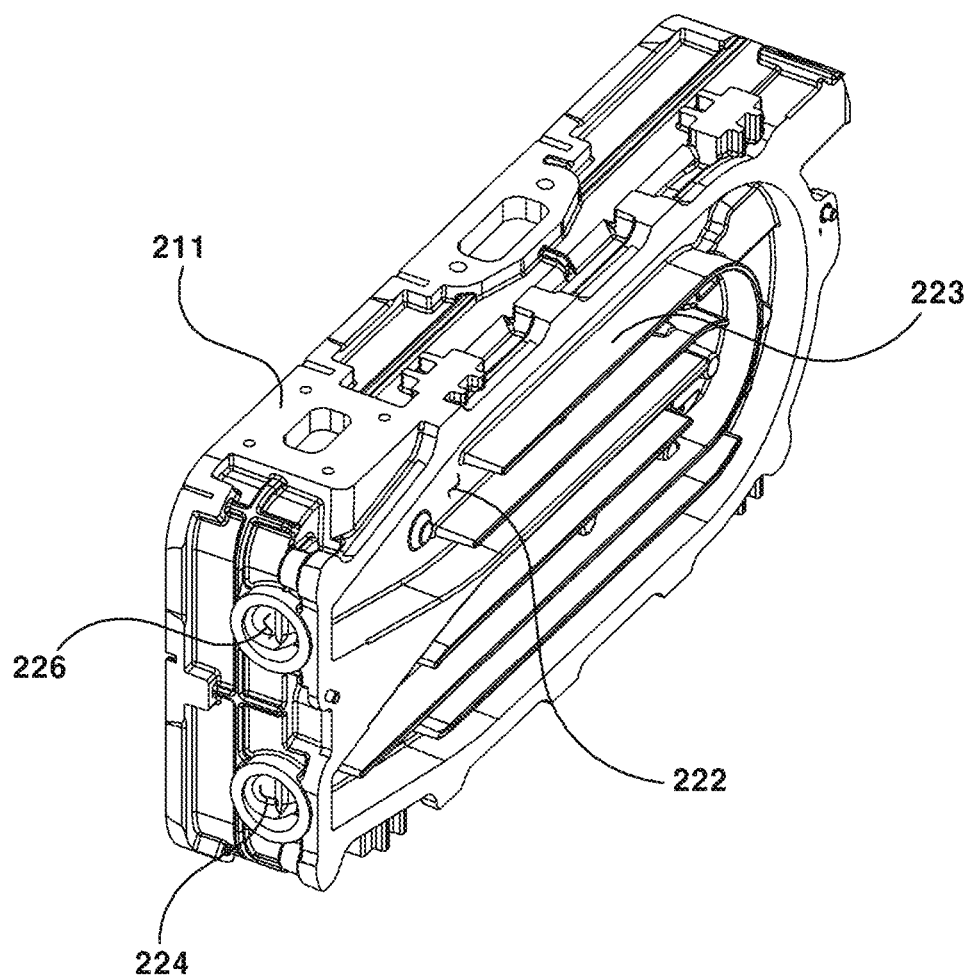
FIG. 10 is a cross-sectional view of a bracket according to the second embodiment of the present invention.

Referring to FIGS. 8 to 10, a converter 200 according to the second embodiment of the present invention comprises: a housing 211; one or more heating elements 114 disposed on one surface of the housing 211; and a refrigerant fluid channel 222 disposed on the other surface of the housing 211.

A converter 200 according to the present embodiment is an electrical device provided in an automobile, an air conditioner, and the like, and is an electronic circuit device that performs conversion from a power source of a certain voltage to a power source of a different voltage. For example, the converter 200 may be a DC-DC converter. However, the configuration according to the present embodiment is not limited thereto, and can be applied to various electrical devices including the above-described types.

The housing 211 has a rectangular cross-sectional shape and comprises a refrigerant fluid channel 222 in which a refrigerant flows, and one or more heat generating elements 114. In FIG. 8, shows an example in which one heat generating element is disposed.

Examples of the heat generating element may include a printed circuit board on which a plurality of electronic components are mounted, a transformer for adjusting a voltage, and an inductor for obtaining an inductance.

In detail, a receiving portion 212 on which the heat generating elements 114 are disposed is formed on a surface of the housing 211. The receiving portion 212 is formed in a groove shape having a bottom surface on one surface of the housing 211 to form a space in which the heating elements 114 are disposed. A receiving groove 213 may be formed on a bottom surface of the receiving portion 212 for receiving a case 110 which accommodates the heating elements 114. The receiving groove 213 may be recessed from the bottom surface of the receiving portion 212 to accommodate a portion of the lower portion of the case 110. After a plurality of heat generating elements are disposed on the receiving portion 212, a separate cover may be coupled to one surface of the housing 211 to cover the receiving portion 212.

A refrigerant fluid channel 222 through which the refrigerant flows is formed on the other surface of the housing 211. The refrigerant fluid channel 222 may be divided through one or more partitions 223 being protruded from the other surface of the housing 211. One end of the refrigerant fluid channel 222 communicates with a refrigerant inlet 224 formed on a side surface of the housing 211 and the other end of the refrigerant fluid channel 222 communicates with refrigerant outlet 226 formed in the region spaced apart from the refrigerant inlet 224 in the side surface of the housing 211. Therefore, the refrigerant flowing from the refrigerant inlet 224 into the housing 211 circulates along the refrigerant fluid channel 222. The refrigerant having undergone the heat exchange may be discharged to the outside of the housing 211 through the refrigerant outlet 226. As the refrigerant flows along the other surface of the housing 211, heat generated from one or more of the heat generating elements 114 disposed on one surface of the housing 211 can be dissipated.

Meanwhile, a cooling pipe 20 according to the first embodiment may be disposed instead of forming the refrigerant fluid channel 222 on the other surface of the housing 211. At this time, the cooling pipe 20 is accommodated in the housing 211 and may be protruded from the other surface of the housing 211. That is, the cooling pipe 20 according to the first embodiment can be applied to the converter 200 according to the present embodiment, and its structure will be included in the technical spirit of the present invention.

Figure 11:
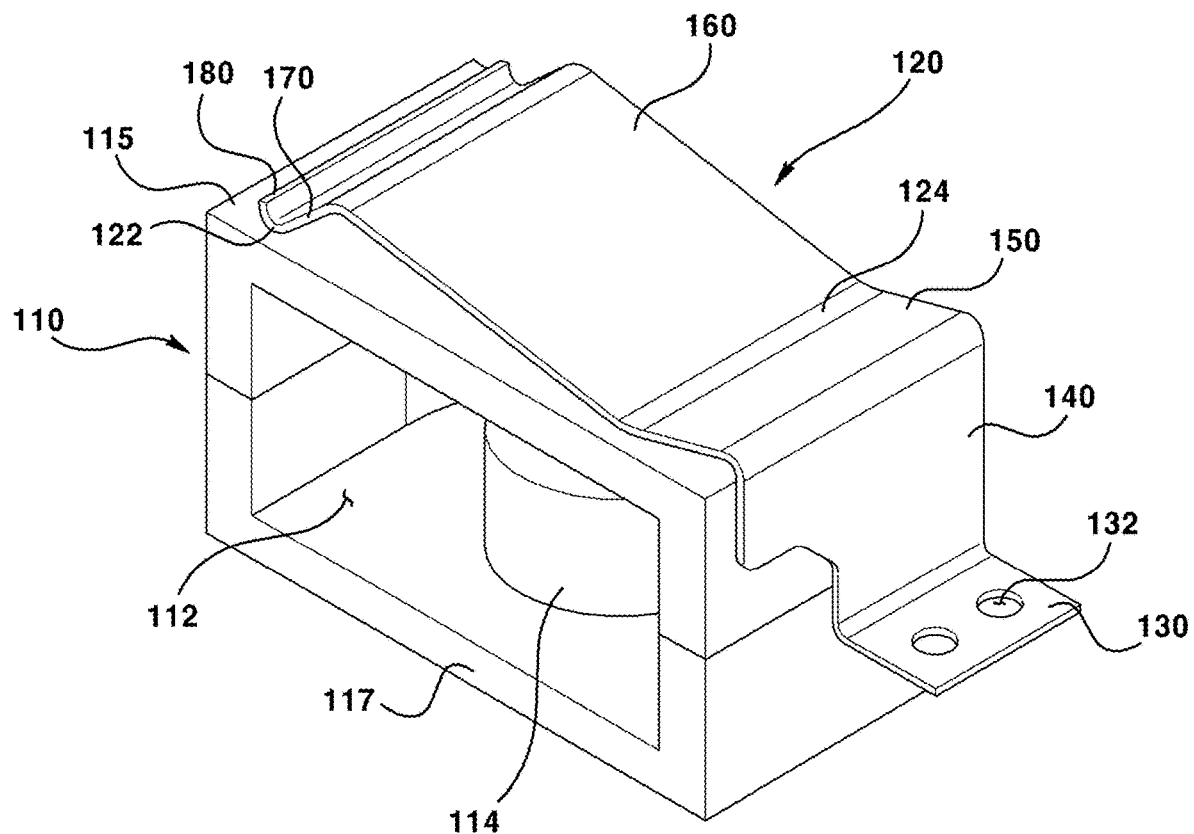
FIG. 11 is a perspective view of a case according to the second embodiment of the present invention.

FIG. 11 is a perspective view of a case according to the second embodiment of the present invention.

Referring to FIG. 11, one or more heating elements 114 are provided in the converter 200 as described above. The heating elements 114 may be accommodated in the case 110 and configured as a module integrated with the case 110.

In detail, the case 110 comprises an upper case 115 and a lower case 117. An inner space 112 in which the heat generating elements 114 are disposed is formed by the coupling of the upper case 115 and the lower case 117. Openings are formed on both side surfaces of the case 110 so that the heat generating elements 114 can be exposed to the outside of the case 110.

The case 110 is coupled to the receiving groove 213 of one surface of the housing 211, as described above. Due to this, the lower surface and a portion of the side surface of the lower case 117 can be accommodated in the receiving groove 213.

Meanwhile, a bracket 120 may be coupled to the case 110. Referring to FIG. 11, the bracket 120 is coupled to the upper side of the case 110. More specifically, the bracket 120 may be coupled to cover the upper surface and one side surface of the outer circumferential surface of the case 110.

The bracket 120 is coupled to the case 110 to dissipate heat generated in the case 110. That is, the bracket 120 is formed of a metal having high thermal conductivity, and it can be understood that the bracket 120 conducts the heat of the case 110 to the outside through the contact with the case 110.

Hereinafter, the configuration of the bracket 120 will be described.

Figure 12:
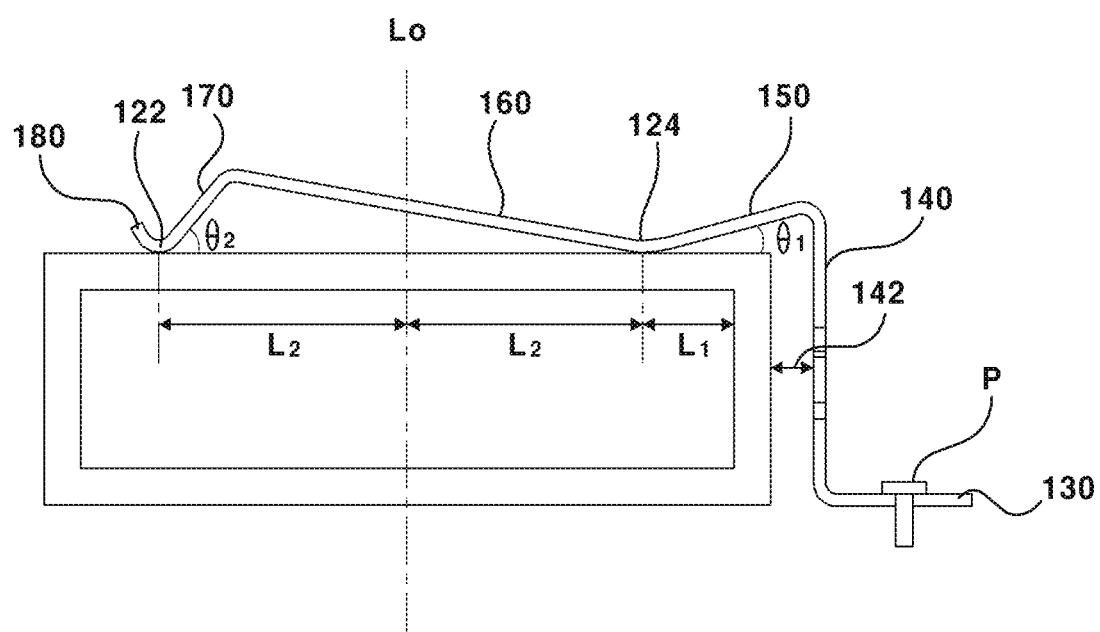
FIG. 12 is a cross-sectional view showing a combined state of the case and the bracket according to the second embodiment of the present invention.
Figure 13:
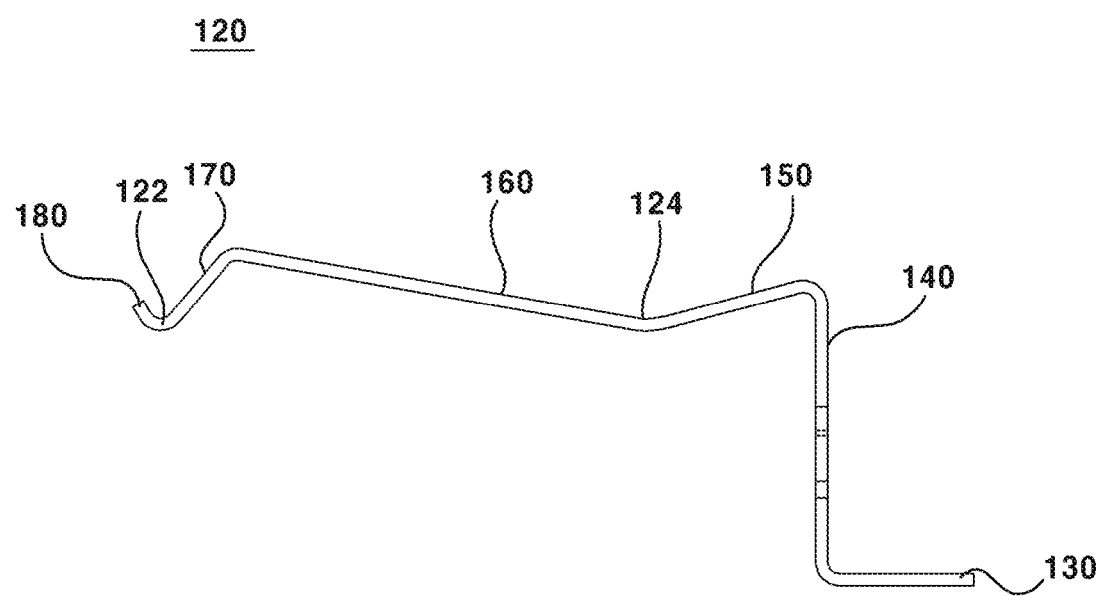
FIG. 13 is a cross-sectional view of the bracket according to the second embodiment of the present invention.

FIG. 12 is a cross-sectional view showing a combined state of the case and the bracket according to the second embodiment of the present invention; and FIG. 13 is a cross-sectional view of the bracket according to the second embodiment of the present invention.

Referring to FIGS. 11 to 13, the bracket 120 according to the second embodiment of the present invention may be formed by bending a plate-shaped plate at least eight times or more. The upper surface of the case 110 to which the bracket 120 is coupled is divided into a horizontal direction and a vertical direction and when a direction having a relatively short length is referred to as a vertical direction, the length corresponding to the length in the vertical direction in the cross-section of the bracket may correspond to the length of the case 110 in the vertical direction. When the bracket 120 is coupled, at least a portion of the upper surface of the case 110 may be covered by the bracket 120.

In detail, the bracket 120 comprises: a first body 130; a second body 140 having one end coupled to the first body 130 and the other end extending upward; a third body 150 having one end coupled to the other end of the second body 140 and the other end extending so as to be in contact with the upper surface of the case 110; a fourth body 160 having one end coupled to the other end of the third body 150 and the other end extending in a direction away from the upper surface of the case 110; a fifth body 170 having one end coupled to the other end of the fourth body 160 and the other end extending so as to be in contact with the other region of the upper surface of the case 110; and a sixth body 180 having one end coupled to the other end of the fifth body 170 and the other end extending in a direction away from the upper surface of the case 110. At this time, the bracket 120 is integrally molded and formed into a single body.

In other words, the bracket 120 has a plurality of bent portions. It is understood that the plurality of bent portions are formed in the regions where the first to sixth bodies 180 meet each other. At this time, a bent portion being contacted with the upper surface of the case 110 may be disposed between the third body 150 and the fourth body 160 among the plurality of bent portions, and between the fifth body 170 and the sixth body 180. This will be described later.

The first body 130 is disposed parallel to the upper surface of the case 110 to fix the bracket 120 to the receiving portion 212 of the housing 211. In some cases, the first body 130 may form a planar surface same as the lower surface of the case 110. A bracket coupling part 217 (FIG. 9) may be provided in a region of the receiving portion 212 facing the first body 130. The bracket 120 is coupled to the bracket coupling part 217 by a screw P so that its position can be fixed. To this end, the first body 130 may be formed with a screw hole 132 through which the screw P is inserted. The screw P is inserted into the screw hole 132 and inserted into the bracket coupling part 217 so that the relative position of the bracket 120 with respect to the case 110 can be fixed, and can be firmly fixed on the bottom surface of the receiving portion 212.

The second body 140 is extended upward from the end portion of the first body 130. The second body 140 is disposed to cover one side surface of the case 110. At this time, a space portion 142 may be formed between the second body 140 and the side surface of the case 110 covered by the second body 140. The space 142 is understood as an area formed by the side surface of the case 110 and the second body 140 being separated from each other. As a result, heat generated inside the case 110 can be efficiently discharged through the space 142.

The third body 150 has one end coupled to the other end of the second body 140 extending upward and the other end coupled to the upper surface of the case 110. Accordingly, the third body 150 may form an inclined surface when the bracket 120 is viewed from the side surface. The inclination angle of the third body 150 may be defined as θ1. Also, in the upper surface of the case 110, the straight line distance from the point where the other end of the third body 150 is in contact with the inner side surface of the case 110 to the upper surface of the case 110 may be defined as L1.

One end of the fourth body 160 is coupled to the other end of the third body 150. Therefore, it can be understood that one end of the fourth body 160 is coupled to the upper surface of the case 110. The other end of the fourth body 160 may be extended away from the upper surface of the case 110, that is, upward. At this time, the direction in which the other end of the fourth body 160 is extended may be a direction away from the second body 140. Accordingly, the fourth body 160 may also form an inclined surface when the bracket 120 is viewed from the side surface.

The fifth body 170 has one end coupled to the other end of the fourth body 160 and the other end coupled to the upper surface of the case 110. Accordingly, the bracket 120 has contact areas at two places through the upper surface of the case 110, the other end of the fifth body 170, and the other end of the third body 150, respectively. Since the fifth body 170 also includes the other end being in contact with the upper surface of the case 110 from one end spaced apart upward from the upper surface of the case 110, an inclined surface is formed when viewed from the side. At this time, the angle formed by the fifth body 170 with the upper surface of the case 110 may be defined as θ2. At this time, the angle θ2 is formed larger than the angle θ1. Due to this, the area of the bracket 120, which is in contact with the upper surface of the case 110, can be symmetrical with respect to the center of the case 110.

The sixth body 180 has one end coupled to the other end of the fifth body 170 and the other end extending in a direction away from the upper surface of the case 110. The sixth body 180 may also form an inclined surface when the bracket 120 is viewed from the side. The sixth body 180 may have a relatively shortest length as compared with the first to fifth bodies 130, 140, 150, 160, and 170.

Meanwhile, FIG. 9 illustrates only a portion of the upper surface of the case 110 is covered by the third to sixth bodies 150, 160, 170 and 180. However, the extended length of the third to sixth bodies 150, 160, 170 and 180 may be formed to correspond to the length of the case 110 in the horizontal direction to cover the entire upper surface of the case 110.

As described above, the bracket 120 may be in contact with the upper surface of the case 110 at a plurality of regions. In detail, the bracket 120 comprises: a first contact portion 124 to which the other end of the third body 150 and one end of the fourth body 160 are coupled; and a second contact portion 122 to which the other end of the fifth body 170 and one end of the first contact portion 180 is coupled, and in contact with the upper surface of the case 110 in two regions where the first and second contact portions 124 and 122 are located. The first contact portion 124 and the second contact portion 122 may be welded to the upper surface of the case 110 and fixed thereto.

Due to this, since the bracket 120 is in contact with a plurality of regions of the case 110, the heat generated from the case 110 can be more efficiently conducted to the bracket 120. Further, since the cooling surface is expanded by the bracket 120, there is an advantage that the heat radiation efficiency of the converter 200 can be increased.

The first contact portion 124 and the second contact portion 122 are disposed at mutually symmetrical positions with respect to the center of the case 110. The first contact portion 124 and the second contact portion 122 are disposed symmetrically with respect to a virtual line L0 connecting the center of the upper surface of the case 110 and the center of the lower surface of the case 110. In other words, the straight line distance from the first contact portion 124 to the imaginary line L0 is the same as the straight line distance from the second contact portion 122 to the imaginary line L0.

Therefore, there is an advantage that the heat generated inside the case 110 can be uniformly conducted through the first contact portion 124 and the second contact portion 122 of the bracket 120. That is, since the first contact portion 124 and the second contact portion 122 are disposed symmetrically with respect to the center of the case 110, the bracket 120 can perform heat dissipation of the converter 200 in a wider range than the installed region, and thus there is an advantage that the heat dissipating efficiency can be increased.

It should be noted that the exemplary embodiments disclosed in the drawings are merely examples of specific examples for the purpose of understanding, and are not intended to limit the scope of the present invention. It will be apparent to those skilled in the art that other modifications based on the technical spirit of the present invention are possible in addition to the exemplary embodiments disclosed herein.

The invention claimed is:

1. A converter comprising:
a housing;
a plurality of heat generating elements disposed in the housing; and
a pipe disposed in the housing and including an inlet and an outlet,
wherein the pipe is formed in a tube shape having two ends and with a constant cross-sectional area in a vertical direction from the inlet to the outlet,
wherein the pipe is disposed at a position overlapping with the plurality of heat generating elements in the vertical direction,
wherein the housing includes a fluid channel in which the pipe is disposed, the fluid channel being disposed on an upper surface of the housing,
wherein the pipe is surrounded by the fluid channel except for the inlet and the outlet,
wherein the pipe comprises:
a first straight portion extending horizontally from the inlet;
a first bent portion bent inwardly from an end portion of the first straight portion; and
a second straight portion extending horizontally from an end of the first bent portion,
wherein the housing comprises the upper surface, a lower surface, a first side surface connecting the upper surface to the lower surface, a second side surface connecting the upper surface to the lower surface, a third side surface connecting the upper surface to the lower surface, and a fourth side surface connecting the upper surface to the lower surface, and
wherein the housing comprises a first plurality of heat dissipation fins on the first side surface, a second plurality of heat dissipation fins on the second side surface, a third plurality of heat dissipation fins on the third side surface, a fourth plurality of heat dissipation fins on the fourth side surface, and a fifth plurality of heat dissipation fins on the upper surface.

2. The converter according to claim 1, wherein both ends of the pipe are exposed towards outside of the housing from the inlet and the outlet.

3. A converter comprising:
a housing;
a plurality of heat generating elements disposed in the housing; and
a pipe disposed in the housing and including an inlet and an outlet,
wherein the pipe is formed in a tube shape having two ends and with a constant cross-sectional area in a vertical direction from the inlet to the outlet,
wherein the pipe is disposed at a position overlapping with the plurality of heat generating elements in a vertical direction,
wherein the housing includes a fluid channel in which the pipe is disposed,
wherein the pipe is surrounded by the fluid channel except for the inlet and the outlet,
wherein the pipe comprises:
a first straight portion extending horizontally from the inlet;
a first bent portion bent inwardly from an end portion of the first straight portion; and
a second straight portion extending horizontally from an end of the first bent portion, and
wherein the pipe and the housing are integrally formed by an insert injection molding method.

4. The converter according to claim 1, comprising a cover surrounding the fluid channel.

5. The converter according to claim 4, wherein the cover is formed integrally with the housing and is a same material as the housing.

6. A converter comprising:
a housing;
a plurality of heat generating elements disposed in the housing; and
a pipe disposed in the housing and including an inlet and an outlet,
wherein the pipe is formed in a tube shape having two ends and with a constant cross-sectional area in a vertical direction from the inlet to the outlet,
wherein the pipe is disposed at a position overlapping with the plurality of heat generating elements in a vertical direction,
wherein the housing includes a fluid channel in which the pipe is disposed,
wherein the pipe is surrounded by the fluid channel except for the inlet and the outlet,
wherein the pipe comprises:
a first straight portion extending horizontally from the inlet;
a first bent portion bent inwardly from an end portion of the first straight portion; and
a second straight portion extending horizontally from an end of the first bent portion,
wherein the converter comprises a cover surrounding the fluid channel, and
wherein the housing includes a stepped portion formed corresponding to a shape of the fluid channel.

7. The converter according to claim 1, wherein
a surface facing the heat generating elements of an inner circumferential surface of the flow channel is a planar surface.

8. The converter according to claim 1, wherein
the pipe has a plurality of linear portions and a plurality of bending portions connecting the linear portions, wherein
the flow rate of the refrigerant flowing through the linear portions is constant.

9. The converter according to claim 8, wherein
the bent portions are arranged opposite to a region facing the heat generating elements.

10. The converter according to claim 1, wherein the pipe includes a flat portion and a curved portion, and
the flat portion is disposed on an outer surface of the pipe facing the heat generating element.

11. The converter according to claim 1, wherein the plurality of heat generating elements include a transformer and an inductor.

12. The converter according to claim 1, wherein through-holes are formed on side surfaces of the housing, wherein each end of the pipe protrudes through a respective one of the through-holes.

13. The converter according to claim 6, wherein the housing includes a plurality of heat dissipation fins protruding from an area other than the stepped portion.

14. A converter comprising:
a housing;
a plurality of heat generating elements disposed in the housing; and
a pipe disposed in the housing and including an inlet and an outlet,
wherein the pipe is formed in a tube shape with a constant cross-sectional area in a vertical direction from the inlet to the outlet,
wherein the pipe is disposed at a position overlapping with the plurality of heat generating elements in the vertical direction,
wherein the housing includes a fluid channel in which the pipe is disposed, the fluid channel being disposed on an upper surface of the housing,
wherein the pipe is surrounded by the fluid channel except for the inlet and the outlet,
wherein the housing comprises a cover surrounding the fluid channel,
wherein the housing comprises the upper surface, a lower surface, a first side surface connecting the upper surface to the lower surface, a second side surface connecting the upper surface to the lower surface, a third side surface connecting the upper surface to the lower surface, and a fourth side surface connecting the upper surface to the lower surface, and
wherein the housing comprises a first plurality of heat dissipation fins on the first side surface, a second plurality of heat dissipation fins on the second side surface, a third plurality of heat dissipation fins on the third side surface, a fourth plurality of heat dissipation fins on the fourth side surface, and a fifth plurality of heat dissipation fins on the upper surface.

15. The converter according to claim 14, wherein the pipe is formed in a tube shape with a constant cross-sectional area in the vertical direction from the inlet to the outlet.

16. The converter according to claim 15, wherein the pipe is exposed to outside of the housing at the inlet and the outlet.

17. The converter according to claim 14, wherein
the housing includes a stepped portion formed corresponding to the shape of the fluid channel.

18. The converter according to claim 17, wherein the fifth plurality of heat dissipation fins protrudes from an area other than the stepped portion.

19. The converter according to claim 14, wherein the plurality of heat generating elements include a transformer and an inductor.

\* \* \* \* \*